United States Patent
Takamine

(10) Patent No.: US 6,713,940 B2
(45) Date of Patent: Mar. 30, 2004

(54) SURFACE ACOUSTIC WAVE DEVICE

(75) Inventor: Yuichi Takamine, Kanazawa (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 25 days.

(21) Appl. No.: 10/029,989

(22) Filed: Dec. 31, 2001

(65) Prior Publication Data

US 2002/0135267 A1 Sep. 26, 2002

(30) Foreign Application Priority Data

Jan. 10, 2001 (JP) ........................................ 2001-002838

(51) Int. Cl.[7] .............................................. H01L 41/08
(52) U.S. Cl. ....................................... 310/313 R; 33/193
(58) Field of Search .......................... 310/313 R, 313 B; 333/193

(56) References Cited

U.S. PATENT DOCUMENTS

| | | | | |
|---|---|---|---|---|
| 5,568,002 A | * | 10/1996 | Kawakatsu et al. | 310/313 B |
| 5,585,684 A | * | 12/1996 | Abe | 310/313 A |
| 5,790,000 A | * | 8/1998 | Dai et al. | 333/193 |
| 5,847,626 A | * | 12/1998 | Taguchi et al. | 333/193 |
| 5,994,980 A | * | 11/1999 | Tada | 333/193 |
| 6,081,172 A | * | 6/2000 | Strauss et al. | 333/193 |
| 6,255,915 B1 | * | 7/2001 | Edmonson | 333/193 |
| 6,483,402 B2 | * | 11/2002 | Endoh et al. | 333/193 |
| 6,556,100 B2 | * | 4/2003 | Takamine | 333/193 |

FOREIGN PATENT DOCUMENTS

| | | |
|---|---|---|
| JP | 8-046476 A | 2/1996 |
| JP | 9-284093 | 10/1997 |
| JP | 10-313229 A | 11/1998 |
| JP | 11-330898 A | 11/1999 |
| JP | 2000-049565 A | 2/2000 |
| JP | 2000-201049 A | 7/2000 |

\* cited by examiner

*Primary Examiner*—Mark Budd
(74) *Attorney, Agent, or Firm*—Keating & Bennett, LLP

(57) ABSTRACT

A surface acoustic wave device includes a plurality of surface acoustic wave filters having different center frequencies contained in a package. In the surface acoustic wave device, one of the input terminal or the output terminal of at least one of the plurality of surface acoustic wave filters is a balanced terminal and the other is an unbalanced terminal.

17 Claims, 13 Drawing Sheets

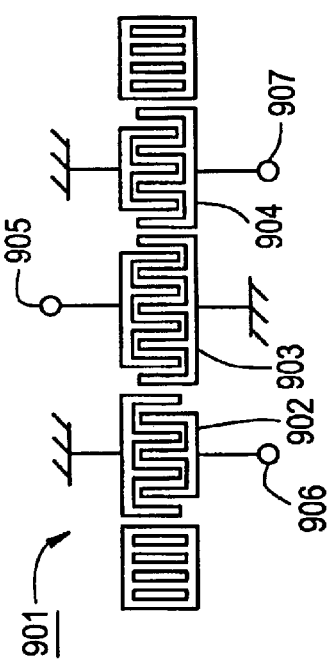
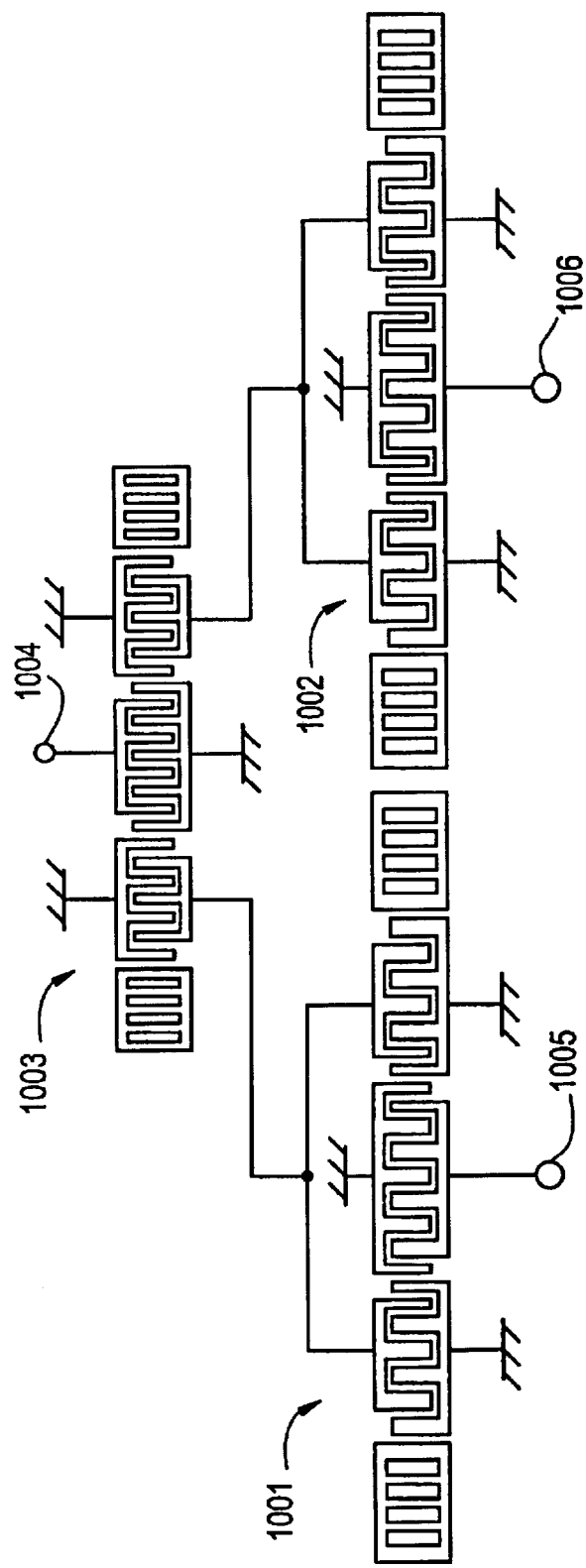
FIG. 11
FIG. 12

SURFACE ACOUSTIC WAVE DEVICE

BACKGROUND OF THE INVENTION

1. Field of the Invention

The present invention relates to surface acoustic wave devices, and more specifically, to a surface acoustic wave device including a plurality of surface acoustic wave filters contained in a single package.

2. Description of the Related Art

In recent years, multiband cellular phones compatible with two or more communications systems have been designed with the aim of improving functionality of mobile communications devices. A cellular phone of this type requires a broadband filter. However, it has been difficult to implement a broadband filter which covers two or more bands and which causes only small loss.

Accordingly, surface acoustic wave devices incorporating a plurality of surface acoustic wave filters contained in a single package, as shown in FIGS. 18 and 19, have been widely used.

In the surface acoustic wave device 100 shown in FIG. 18, surface acoustic wave filters 101 and 102 having different center frequencies are contained in a package 103. In the surface acoustic wave filter 101, a signal is input to an unbalanced input terminal 104, and a signal is output from an unbalanced output terminal 105. Similarly, in the surface acoustic wave filter 102, a signal is input from an unbalanced input terminal 106, and a signal is output from an unbalanced output terminal 107.

That is, the surface acoustic wave device shown in FIG. 18 outputs two unbalanced output signals corresponding to two unbalanced input signals.

In another surface acoustic wave device of the related art, a surface acoustic wave device 200 shown in FIG. 19, two surface acoustic wave filters 201 and 202 having different center frequencies are contained in a package 203. The surface acoustic wave filters 201 and 202 share a common unbalanced input terminal 204. That is, the surface acoustic wave filters 201 and 202 receive a signal input to the unbalanced input terminal 204, and output signals respectively to unbalanced output terminals 205 and 206. In this example, because the impedance on the side of the common unbalanced input terminal 204 is capacitive, an inductor 207 is connected in parallel to the unbalanced input terminal 204. The inductor 207 is arranged internally or externally with respect to the package 203. A surface acoustic wave device of this type is disclosed, for example, in Japanese Unexamined Patent Application Publication No. 11-68511.

When two surface acoustic wave filters with unbalanced input and output terminals, having different center frequencies, are contained in a single package, there has been a problem that stopband attenuation is reduced due to electromagnetic or capacitive mutual interference between the two surface acoustic wave filters, which results in the filter failing to provide a sufficient attenuation. The mutual interference can be reduced to a certain extent when the electrical interconnection between the surface acoustic wave filters and electrode pads of the package is achieved by wire bonding, by optimizing the layout of the electrode pads, bonding conditions, and other methods. However, it has been difficult to reduce the mutual interference particularly when the surface acoustic wave filters are electrically connected to and contained in the package by the face-down manufacturing method compared with the case of wire bonding.

SUMMARY OF THE INVENTION

In order to overcome the problems described above, preferred embodiments of the present invention provide a surface acoustic wave device including a plurality of surface acoustic wave filters contained in a single package, in which the effect of mutual interference between the plurality of surface acoustic wave filters is minimized so as to provide a sufficient stopband attenuation.

According to one preferred embodiment of the present invention, a surface acoustic wave device includes a package, and a plurality of surface acoustic wave filters having different center frequencies and contained in the package, wherein one of the input terminal and the output terminal of at least one of the plurality of surface acoustic wave filters is a balanced terminal and the other of the input terminal and the output terminal is an unbalanced terminal.

As a result of this unique arrangement, stopband attenuation is increased compared with the surface acoustic wave device 100 according to the related art shown in FIG. 18 in which a plurality of surface acoustic wave filters with an unbalanced input and an unbalanced output is contained in a single package.

Preferably, in the surface acoustic wave device, one of the input terminal or the output terminal of each of the plurality of surface acoustic wave filters is a balanced terminal and the other is an unbalanced terminal.

Accordingly, stopband attenuation is increased for all of the surface acoustic wave filters included in the surface acoustic wave device.

Furthermore, the unbalanced terminal may be shared among the plurality of surface acoustic wave filters.

Accordingly, stopband attenuation is increased compared with the surface acoustic wave device 200 with a single unbalanced input and two unbalanced outputs according to the related art shown in FIG. 19.

The surface acoustic wave device according to another preferred embodiment of the present invention preferably includes an impedance matching element attached to the shared unbalanced terminal.

Preferably, the impedance matching element is an inductor attached in parallel to the unbalanced terminal. Accordingly, frequency characteristics are even more improved.

Furthermore, at least one of the plurality of surface acoustic wave filters is preferably a surface acoustic wave filter of the type using cascaded resonators.

Furthermore, at least one of the plurality of surface acoustic wave filters preferably has a different electrode thickness from the other surface acoustic wave filters.

Accordingly, the filter characteristics of each of the surface acoustic wave filters can be optimized by varying the electrode thicknesses thereof, so as to achieve favorable frequency characteristics.

The plurality of surface acoustic wave filters may be disposed on a single piezoelectric substrate.

Accordingly, the size of the surface acoustic wave device can be minimized.

According to another preferred embodiment of the present invention, a communications device includes a surface acoustic wave device according to preferred embodiments described above, which surface acoustic wave device defines a band-pass filter.

Other features, elements, characteristics and advantages of the present invention will become more apparent from the following detailed description of preferred embodiments with reference to the attached drawings.

BRIEF DESCRIPTION OF THE DRAWINGS

FIG. 11 is a schematic plan view showing a surface acoustic wave filter of the type using cascaded resonators as an example of surface acoustic wave filter used to implement various preferred embodiments of the present invention;

FIG. 12 is a schematic plan view showing a surface acoustic wave filter of the type using cascaded resonators as another example of surface acoustic wave filter used to implement various preferred embodiments of the present invention;

DETAILED DESCRIPTION OF PREFERRED EMBODIMENTS

The present invention will be described with reference to preferred embodiments thereof and with reference to the accompanying drawings.

Figure 1:
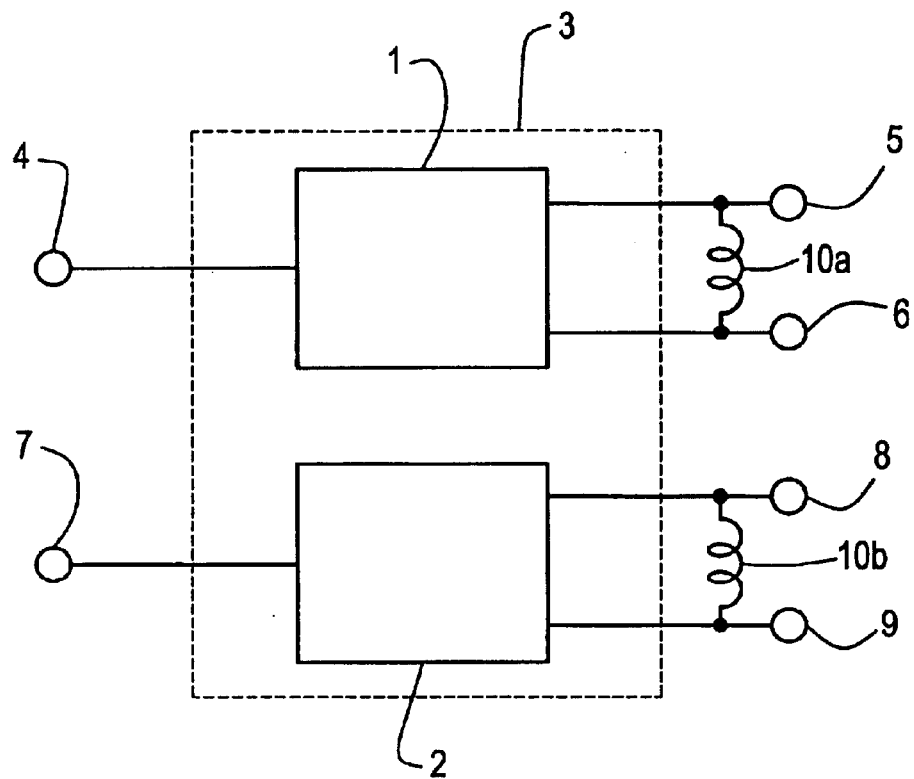
FIG. 1 is a schematic construction diagram of a surface acoustic wave device according to a first preferred embodiment of the present invention.

FIG. 1 schematic construction diagram of a surface acoustic wave device according to a first preferred embodiment of the present invention. The surface acoustic wave device according to the first preferred embodiment preferably includes a surface acoustic wave filter 1 for DCS reception and a surface acoustic wave filter 2 for PCS reception included in a single package 3. The surface acoustic wave filters 1 and 2 are preferably integral and are defined by electrodes disposed on a single piezoelectric substrate. As the piezoelectric substrate, a 40±5° Y-cut X-propagating $LiTaO_3$ substrate is preferably used. Electrodes including interdigital transducers constituting the surface acoustic wave filters 1 and 2 are preferably made of Al.

Figure 2:
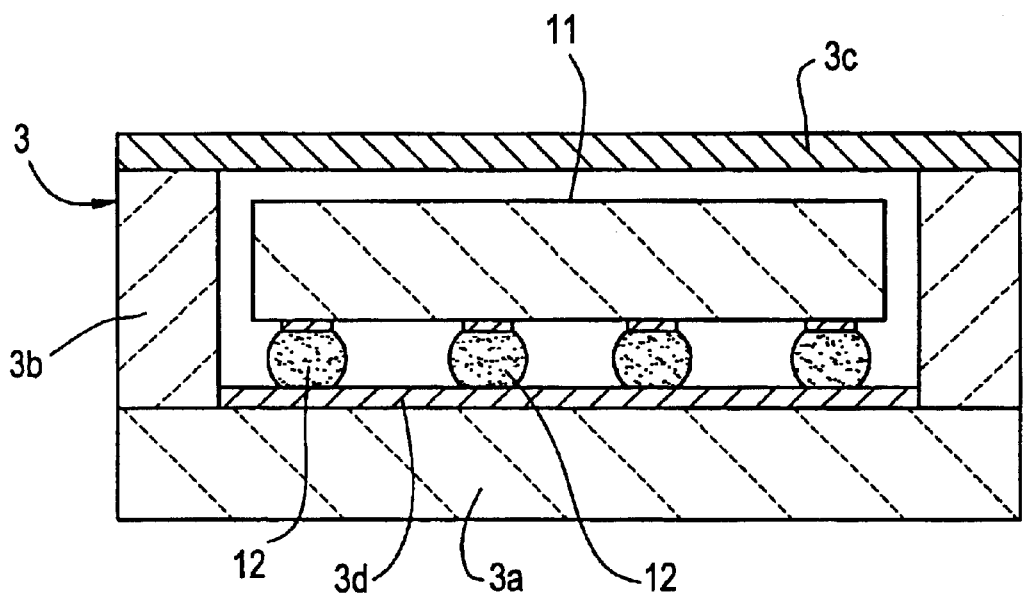
FIG. 2 is a schematic sectional front view of the surface acoustic wave device according to the first preferred embodiment of the present invention.

FIG. 2 is a schematic front sectional view of the surface acoustic wave device according to the first preferred embodiment of the present invention.

The surface acoustic wave filters 1 and 2 (not shown in FIG. 2) are implemented using the piezoelectric substrate 11 preferably made of $LiTaO_3$.

The surface acoustic wave device is contained in the package 3 and is preferably mounted via the face-down manufacturing method. That is, the surface of the piezoelectric substrate 11 on which the electrodes constituting the surface acoustic wave filters 1 and 2 are arranged to be facing down.

The package 3 includes a base substrate 3a and a surrounding sidewall 3b fixed on the base substrate 3a. The upside opening of the sidewall 3b is covered by a lid member 3c. Furthermore, on the base substrate 3a, an electrode land 3d for attaching dies is provided. The surface acoustic wave device is joined to the electrode land 3d via bumps 12, and the electrodes of the surface acoustic wave device are electrically connected to the electrode land 3d of the package 3.

Referring back to FIG. 1, the surface acoustic wave filter 1 includes an unbalanced input terminal 4, and balanced output terminals 5 and 6. The surface acoustic wave filter 2 includes an unbalanced input terminal 7, and balanced output terminals 8 and 9.

That is, each of the surface acoustic wave filters 1 and 2 performs a function of unbalanced/balanced conversion. The input terminal and the output terminals may be used in the reverse manner.

Between the balanced output terminals 5 and 6, an inductor 10a with an inductance of approximately 18 nH is attached externally to the package 3. Between the balanced output terminals 8 and 9, an inductor 10b with an inductance of approximately 27 nH is attached externally to the package 3. The inductors 10a and 10b may be disposed on the piezoelectric substrate 11 on which the surface acoustic wave filters 1 and 2 are provided or may be disposed internally within the package 3.

According to this preferred embodiment, in both of the surface acoustic wave filters 1 and 2, stopband attenuation is improved compared with the surface acoustic wave devices according to the related arts in which two surface acoustic wave filters are contained in a single package. This will be described based on an actual experiment.

Figure 3:
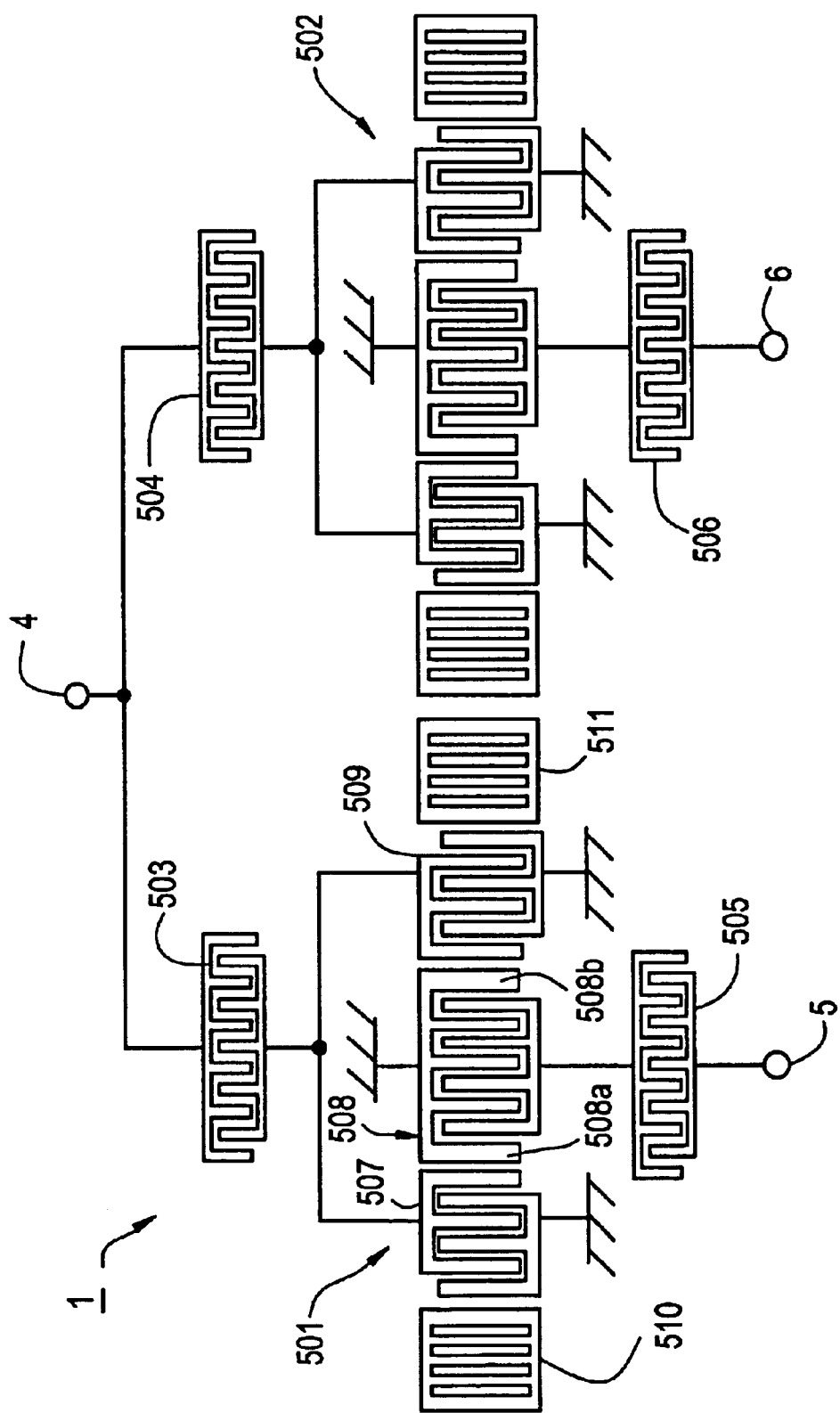
FIG. 3 is a schematic plan view showing the structure of electrodes in one of the surface acoustic wave filters incorporated in the surface acoustic wave device according to the first preferred embodiment of the present invention.
Figure 4:
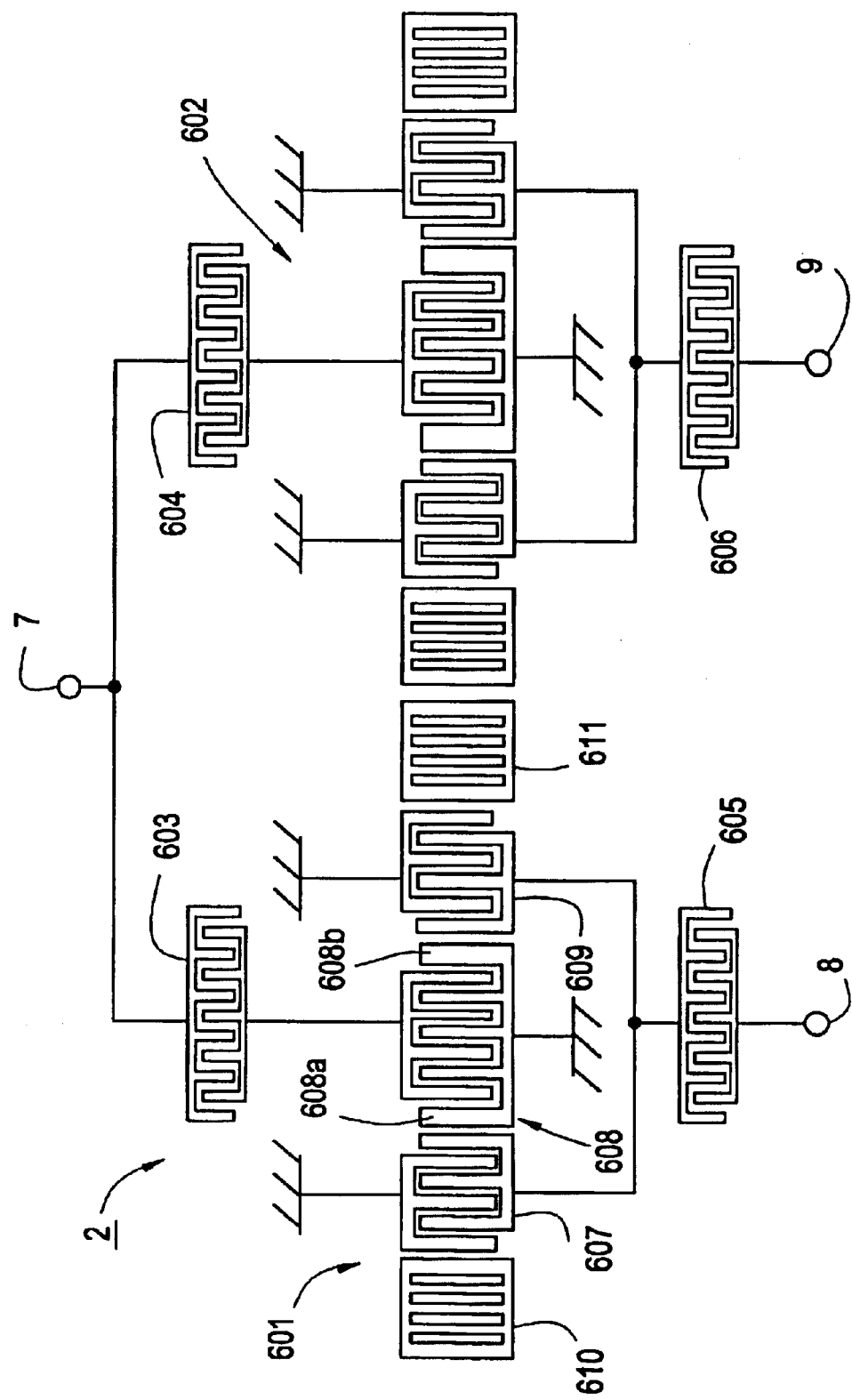
FIG. 4 is a schematic plan view showing the structure of electrodes in the other surface acoustic wave filter incorporated in the surface acoustic wave device according to the first preferred embodiment of the present invention.

FIG. 3 shows the structure of the electrodes in the surface acoustic wave filter 1, and FIG. 4 shows the structures of the electrodes in the surface acoustic wave filter 2 in the present preferred embodiment.

The surface acoustic wave filter 1 used in the experiment included two surface acoustic wave filters 501 and 502 of the type using cascaded resonators, and four surface acoustic wave resonators 503 to 506. The surface acoustic wave filter 501 included first to third IDTs 507 to 509. The IDTs 507 and 509 were disposed on both sides of the middle IDT 508 in the direction of propagation of surface acoustic waves. Furthermore, reflectors 510 and 511 were disposed on both sides of the area where the IDTs 507 to 509 were arranged in the direction of propagation of surface acoustic waves. In FIG. 3, for simplicity, the number of the electrode fingers is shown as smaller than the actual number. The specific design of the surface acoustic wave filter 501 was as follows:

Overlap width of electrode fingers: W=41.7λI;

Number of electrode fingers of IDTs: 22 for IDT 507, 31 for IDT 508, and 22 for IDT 509;

Wavelength of IDTs: λI=2.16 μm;

Wavelength of reflectors λR=2.20 μm;

Number of electrode fingers of reflectors: 120;

Distance between IDTs: 0.76λI;

Distance between IDT and reflector: 0.51λR;

Duty ratio of IDTs: 0.60;

Duty ratio of reflectors: 0.60;

Thickness of electrodes in IDTs and reflectors: 0.08λI

As is apparent from FIG. 3, electrode fingers 508a and 508b on both ends of the second IDT 508 in the middle in the direction of propagation of surface acoustic waves were made wider than the other electrode fingers, so that free spaces between IDTs were made smaller. The surface acoustic wave filter 502 was basically the same as the surface acoustic wave filter 501. However, in order to reverse the phase of signals, the distance between IDTs was made wider by about 0.5λI to be approximately 1.26λI.

The specific design of the surface acoustic wave resonators 503 to 506 is shown in Table 1 below.

TABLE 1

|  | 503 and 504 | 505 and 506 |
|---|---|---|
| Overlap width | 19.0λ | 16.6λ |
| Number of IDTs | 241 | 241 |
| Wavelength λ (both IDTs and reflectors) | 2.11 μm | 2.11 μm |
| Distance between IDT and reflector | 0.50λ | 0.50λ |
| Number of reflectors | 30 | 30 |

TABLE 1-continued

|  | 503 and 504 | 505 and 506 |
|---|---|---|
| Duty (both IDTs and reflectors) | 0.60 | 0.60 |
| Electrode thickness | 0.082λ | 0.082λ |

The surface acoustic wave filter 2 included two surface acoustic wave filters 601 and 602 of the type using cascaded resonators, and four surface acoustic wave resonators 603 to 606, as shown in FIG. 4. The surface acoustic wave filter 601 included first to third IDTs 607 to 609 arranged in the direction of propagation of surface acoustic waves. Furthermore, reflectors 610 and 611 were formed on both sides of the area where the IDTs 607 to 609 were formed in the direction of propagation of surface acoustic waves. In FIG. 4, for simplicity, the number of electrode fingers is shown as smaller than the actual number.

The specific design of the surface acoustic wave filter 601 was as follows:

Overlap width: W=29.7λI;

Number of electrode fingers of IDTs: 24 for IDT 607, 35 for IDT 608, and 24 for IDT 609;

Wavelength of IDTs: λI=2.02 μm;

Wavelength of reflectors λR=2.05 μm;

Number of electrode fingers of reflectors: 100;

Distance between IDTs: 0.79λI;

Distance between IDT and reflector: 0.52λR;

Duty ratio of IDTs: 0.60;

Duty ratio of reflectors: 0.60;

Electrode thickness of IDTs and reflectors: 0.08λI

Electrode fingers 608a and 608b on both ends of the IDT 608 in the direction of propagation of surface acoustic waves were made wider than the other electrode fingers, so that free space between the IDTs was made smaller. The surface acoustic wave filter 602 was basically the same as the surface acoustic wave filter 601. However, in order to reverse the phase of signals, the distance between IDTs was made wider by about 0.5λI to be approximately 1.29λI.

The specific design of the surface acoustic wave resonators 603 to 606 is shown in Table 2 below.

TABLE 2

|  | 603 and 604 | 605 and 606 |
|---|---|---|
| Overlap width | 19.8λ | 34.7λ |
| Number of IDTs | 281 | 281 |
| Wavelength λ (both IDTs and reflectors) | 2.02 μm | 2.02 μm |
| Distance between IDT and reflector | 0.50λ | 0.50λ |
| Number of reflectors | 30 | 30 |
| Duty (both IDTs and reflectors) | 0.60 | 0.60 |
| Electrode thickness | 0.080λ | 0.080λ |

As described above, the electrode thickness of IDTs in the surface acoustic wave filters 501, 502, 601, and 602 was about 8% of the wavelength of the IDTs in both of the surface acoustic wave filters 1 and 2. Thus, the absolute electrode thickness differed between the two surface acoustic wave filters 1 and 2.

Although the two surface acoustic wave filters 1 and 2 with different electrode thicknesses were disposed on the single piezoelectric substrate 11 in this example of the present preferred embodiment, the surface acoustic wave filters 1 and 2 may be disposed on separate piezoelectric substrates, that is, two piezoelectric substrates for defining the surface acoustic wave filters 1 and 2 thereon may be contained in a single package.

Figure 5:
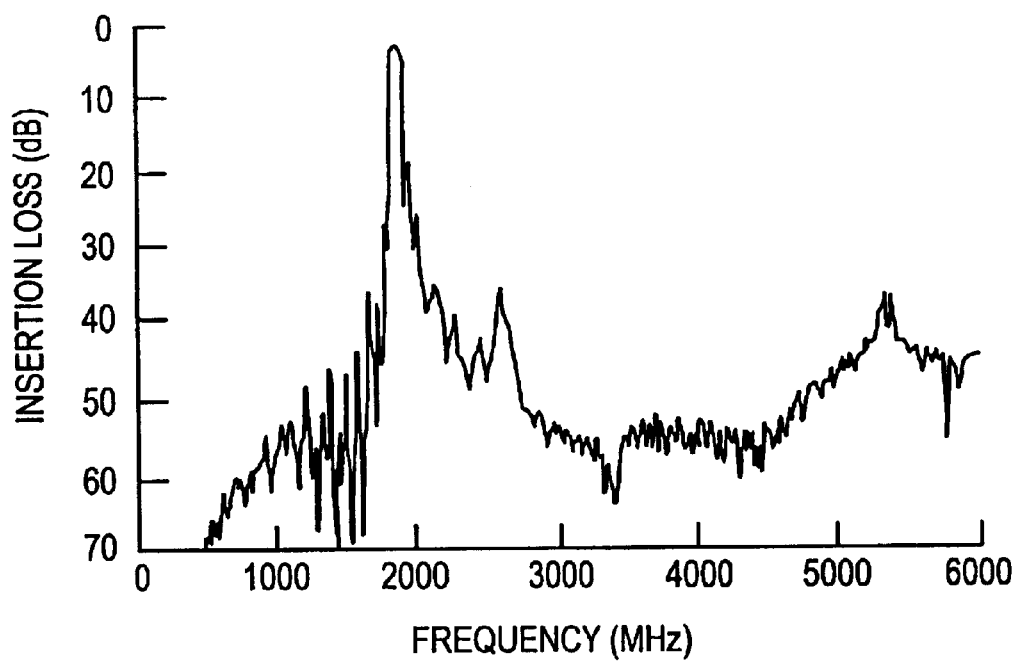
FIG. 5 is a graph showing the frequency characteristics of a surface acoustic wave filter for DCS reception, which is used as one of the surface acoustic wave filters incorporated in the surface acoustic wave device according to the first preferred embodiment of the present invention.
Figure 6:
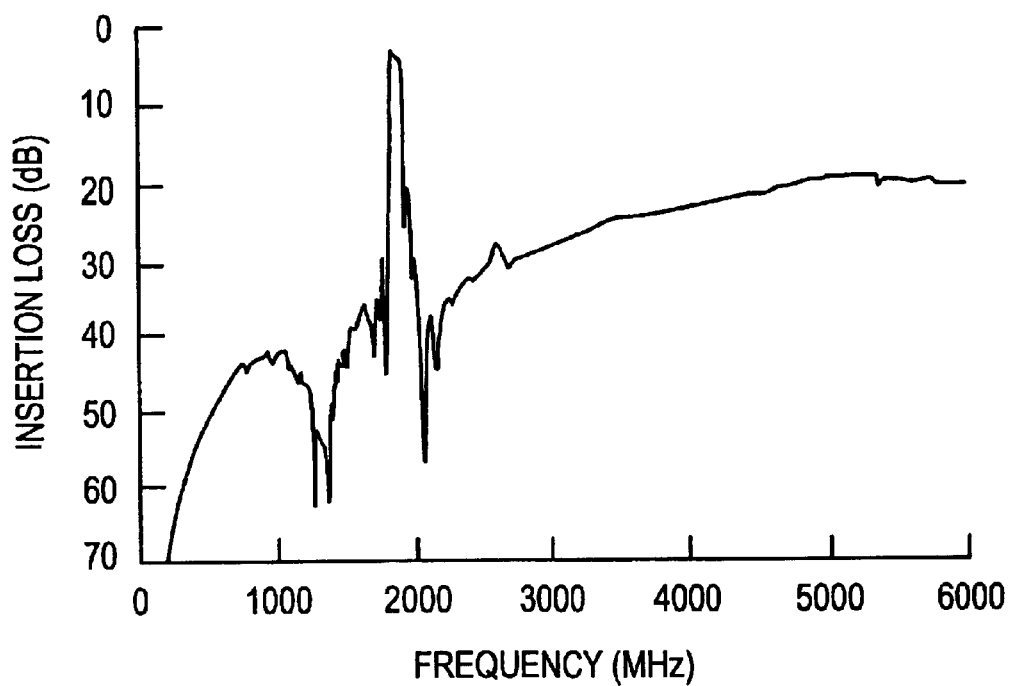
FIG. 6 is a graph showing the frequency characteristics of a surface acoustic wave filter for DCS reception incorporated in a surface acoustic wave device according to a related art.
Figure 7:
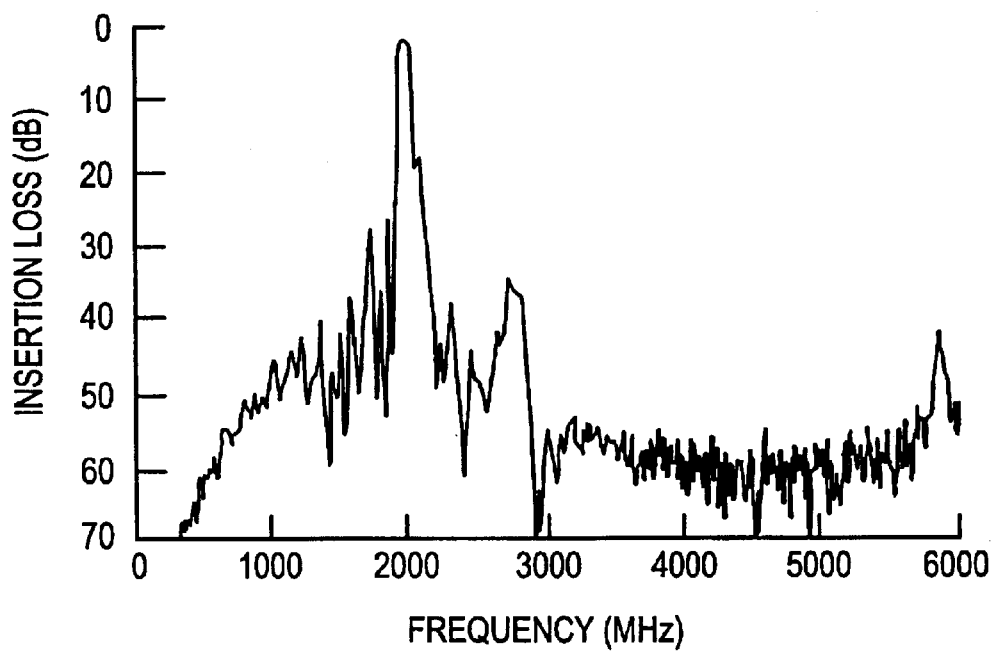
FIG. 7 is a graph showing the frequency characteristics of a surface acoustic wave filter for PCS reception, which is used as the other surface acoustic wave filter incorporated in the surface acoustic wave device according to the first preferred embodiment of the present invention.
Figure 8:
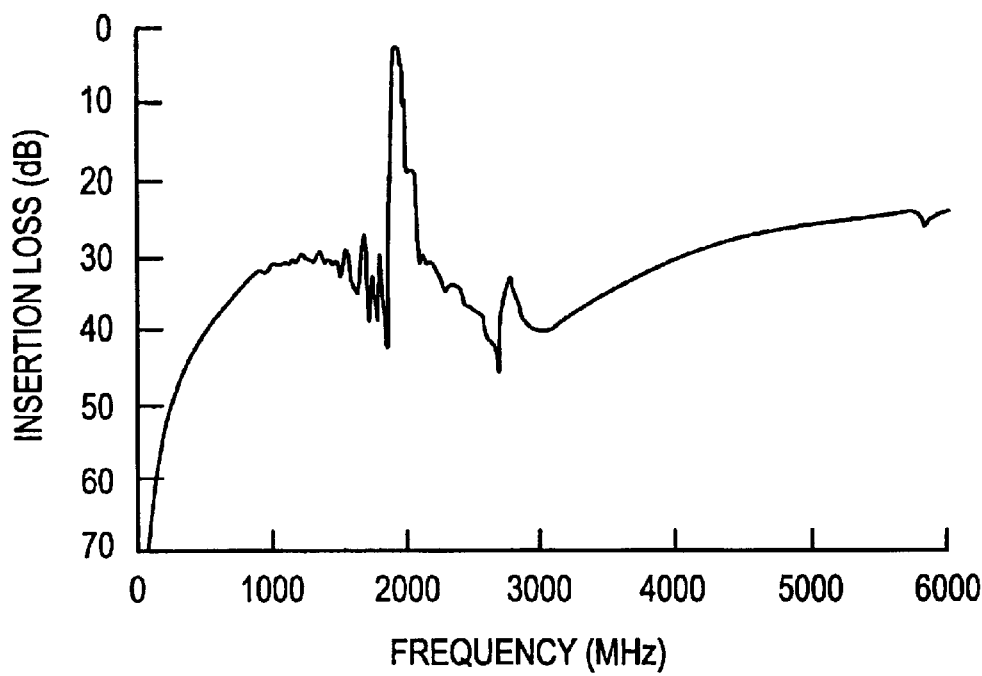
FIG. 8 is a graph showing the frequency characteristics of a surface acoustic wave filter for PCS reception incorporated in the surface acoustic wave device according to the related art.

FIG. 5 shows the frequency characteristics of the surface acoustic wave filter 1 for DCS reception, and FIG. 7 shows the frequency characteristics of the surface acoustic wave filter 2 for PCS reception in this preferred embodiment. For comparison, FIG. 6 shows the frequency characteristics of the surface acoustic wave filter for DCS reception, and FIG. 8 shows the frequency characteristics of the surface acoustic wave filter for PCS reception in the surface acoustic wave device 100 according to the related art shown in FIG. 18, in which two surface acoustic wave filters with unbalanced input and unbalanced output are contained in a single package.

Figure 9:
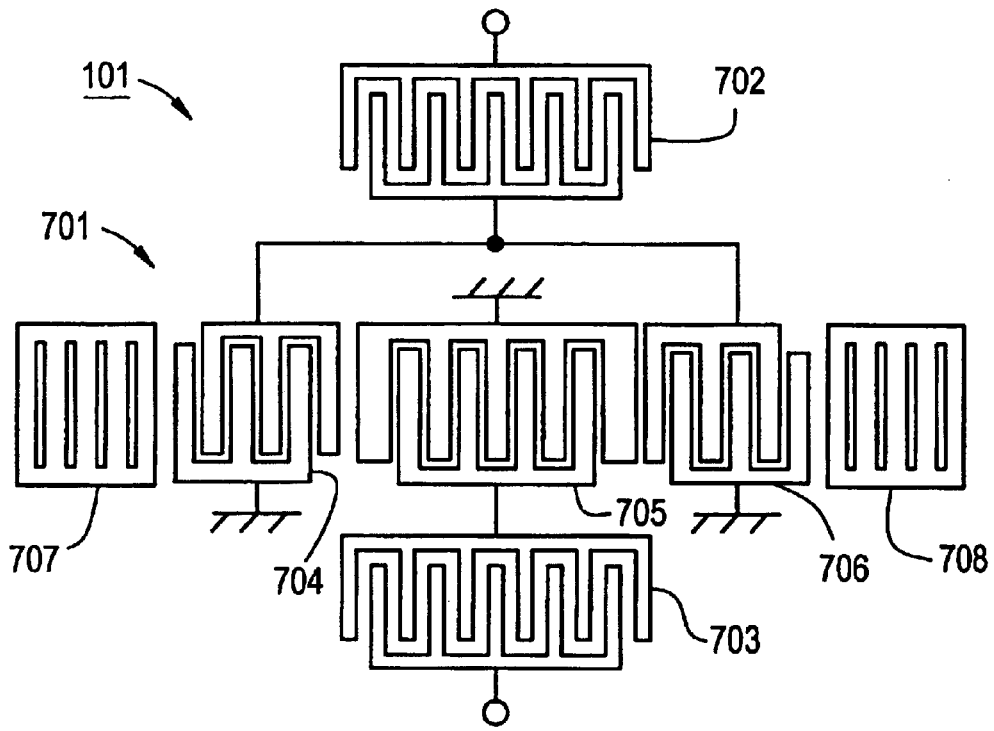
FIG. 9 is a schematic plan view showing the electrode structure of the surface acoustic wave filter for DCS reception incorporated in the surface acoustic wave device according to the related art.
Figure 10:
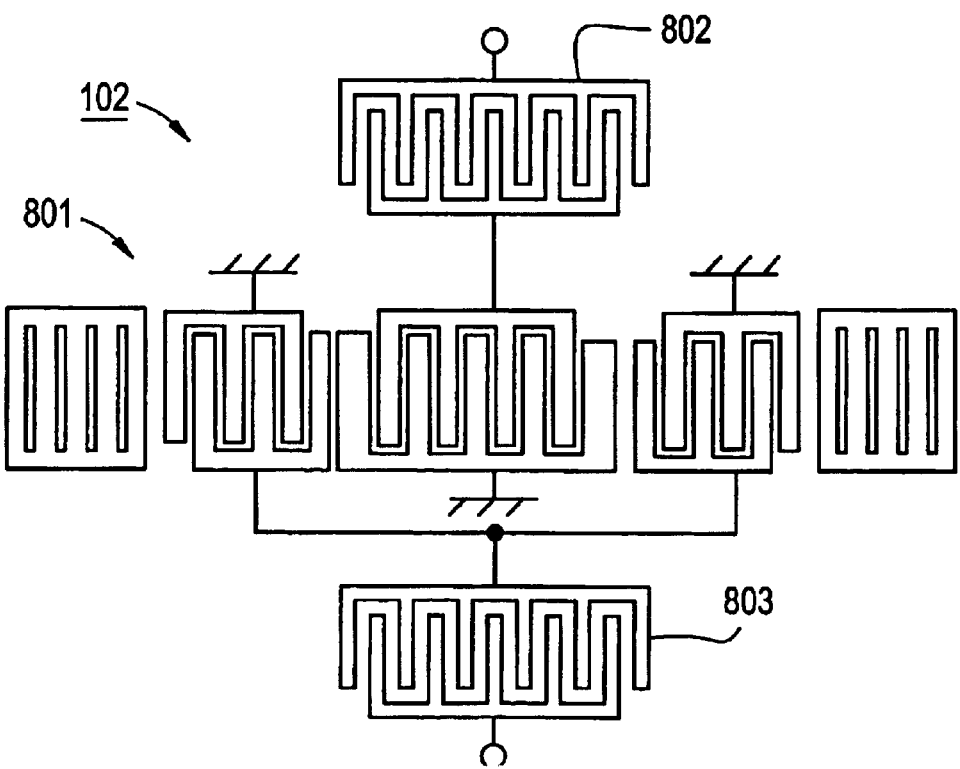
FIG. 10 is a schematic plan view showing the electrode structure of the surface acoustic wave filter for PCS reception incorporated in the surface acoustic wave device according to the related art.

In implementing the surface acoustic wave device 100 according to the related art, the structure of electrodes in the surface acoustic wave filters 101 and 102 were as shown in FIGS. 9 and 10, respectively. More specifically, the surface acoustic wave filter 101 included a surface acoustic wave filter 701 of the type using cascaded resonators, and surface acoustic wave resonators 702 and 703. In the surface acoustic wave filter 701, IDTs 704 to 706 were arranged in the direction of propagation of surface acoustic waves, and reflectors 707 and 708 were arranged on both sides of the area where the IDTs 704 to 706 were located.

The specific design of the surface acoustic wave filter 701 was the same as the surface acoustic wave filter 501 in the surface acoustic wave device according to the present preferred embodiment, except that the overlap width was doubled. Also, the design of the surface acoustic wave resonators 702 and 703 were the same as the surface acoustic wave resonators 503 and 505 in the surface acoustic wave device according to the present preferred embodiment, except that the overlap width was doubled.

The implementation of the surface acoustic wave filter 102 in the surface acoustic wave device 100 according to the related art included a surface acoustic wave filter 801 of the type using cascaded resonators, and two surface acoustic wave resonators 802 and 803, as shown in FIG. 10. The specific design of the surface acoustic wave filter 801 was the same as the surface acoustic wave filter 601 in the present preferred embodiment, except that the overlap width was doubled. Also, the surface acoustic wave resonators 802 and 803 were the same as the surface acoustic wave resonators 603 and 605 in the surface acoustic wave device according to the present preferred embodiment, except that the overlap width of electrode fingers was doubled.

Figure 18:
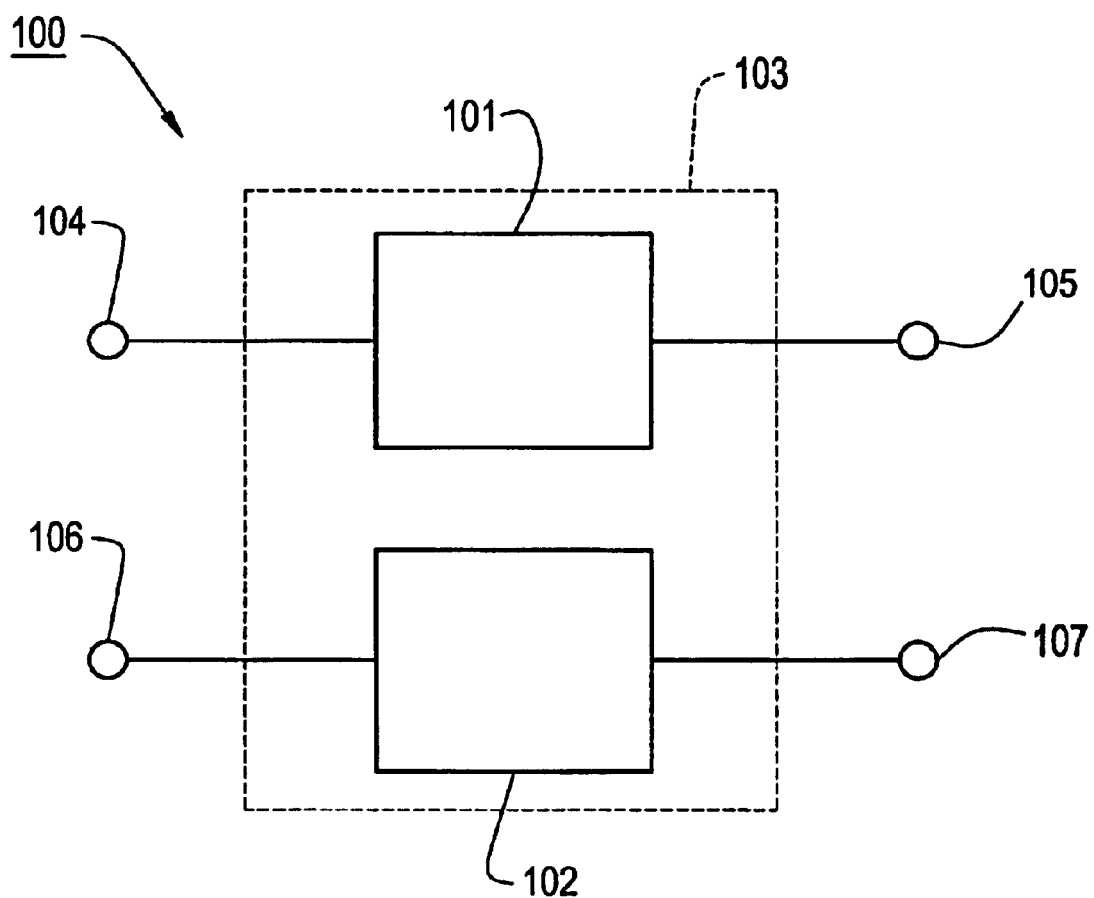
FIG. 18 is a schematic construction diagram of a surface acoustic wave device according to the related art.

The present preferred embodiment and the related art of FIG. 18 differed in that the input impedance and the output impedance were 50 Ω in the surface acoustic wave device according to the related art, whereas the impedance on the unbalanced input side was 50 Ω and the impedance on the balanced output side was 200 Ω in the example of the present preferred embodiment.

By comparing the characteristics shown in FIG. 5 and FIG. 6 and the characteristics shown in FIG. 7 and FIG. 8, respectively, it will be understood that stopband attenuation was improved in each of the surface acoustic wave filters 1 and 2 in the surface acoustic wave device according to the present preferred embodiment compared with the related art. More specifically, for example, the minimum attenuation in a frequency range of about 0 GHz to about 1 GHz was 42 dB in the surface acoustic wave filter for DCS reception in the related art, whereas it was about 55 dB in the example of the present preferred embodiment, achieving an improvement of about 13 dB. Furthermore, as for the surface acoustic wave filter for PCS reception, the minimum attenuation was 32 dB in the surface acoustic wave device according to the related art, whereas it was about 47 dB in the example of the present preferred embodiment, achieving an improvement of about 15 dB. Furthermore, comparing the minimum attenuation in a frequency range of about 4 GHz to about 6 GHz in the filter for DCS reception, the minimum attenuation was 18 dB in the related art, whereas it was about 35 dB in the example of the present preferred embodiment, achieving an improvement of about 17 dB. Similarly, as for the filter for PCS reception, the minimum attenuation was 23 dB in the related art, whereas it was about 42 dB in the present preferred embodiment, achieving an improvement of about 19 dB.

The reason the stopband attenuation was improved in the example of the present preferred embodiment as described above will be described below. The stopband attenuation in a surface acoustic wave device with unbalanced input (output) and balanced output (input), such as in the present preferred embodiment, is significantly affected by the balance of filters. The balance of filters is represented by the difference in the amplitude and phase of the transmission characteristics between the unbalanced terminal and the balanced terminal, respectively referred to as amplitude balance and phase balance.

Assuming that the surface acoustic wave filter with unbalanced input (output) and balanced output (input) is a three-port device, for example, the unbalanced input terminal being port 1 and the pair of balanced output terminals being ports 2 and 3, the amplitude balance $|A|=|20 \log(S21)|-|20 \log(S31)|$, and the phase balance $|B|=|\angle S21 - \angle S31|$, wherein S21 is a transfer factor from port 1 to port 2, and S31 is a transfer factor from port 1 to port 3.

Ideally, the amplitude balance is 0 dB and the phase balance is 0 degrees in the stopband. The stopband attenuation of a filter having an ideal balance is infinite. That is, the stopband attenuation of a surface acoustic wave filter with unbalanced input and balanced output becomes larger compared with a surface acoustic wave filter with unbalanced input and unbalanced output as the balance becomes more approximate to the ideal balance.

Although a 40±5° Y-cut X-propagating $LiTaO_3$ substrate is preferably used in the example of the preferred embodiment, since the present invention is intended to improve the balance of the plurality of the surface acoustic wave filters 1 and 2 and to improve stopband attenuation by providing a function of unbalanced/balanced conversion, the piezoelectric substrate is not limited thereto, and other types of substrates, such as a 64° to 72° Y-cut X-propagating $LiNbO_3$ substrate and a 41° Y-cut X-propagating $LiNbO_3$ substrate, may be used.

Furthermore, in the present preferred embodiment, for example, although the surface acoustic wave filter 1 with unbalanced input and balanced output was implemented using the two surface acoustic wave filters 501 and 502, the construction of the surface acoustic wave filter 1 is not limited thereto as long as it has an unbalanced input and balanced output.

For example, as shown in FIG. 11, the arrangement may be such that a surface acoustic wave filter 901 of the type using cascaded resonators includes first to third IDTs 902 to 904, and reflectors disposed on both sides of the area where the IDTs 902 to 904 are located in the direction of propagation of surface acoustic waves, and the phase of the IDTs 902 and 904 on both sides is reversed relative to the IDT 903, so that a function of unbalanced/balanced conversion is provided. In this example, an unbalanced input terminal 905 is connected to the IDT 903, and balanced output terminals 906 and 907 are connected to the IDTs 902 and 904, respectively.

Furthermore, as shown in FIG. 12, the arrangement may be such that two surface acoustic wave filters 1001 and 1002 of the type using cascaded resonators, in which the phase of the middle IDT is opposite relative to the IDTs on both sides, are connected in parallel, and another surface acoustic wave filter 1003 of the type using cascaded resonators is connected in series. In this example, one end of the surface acoustic wave filter 1003 is connected to an unbalanced input terminal 1004, and the middle IDTs of the surface acoustic wave filters 1001 and 1002 are connected to balanced output terminals 1005 and 1006, respectively.

Figure 13:
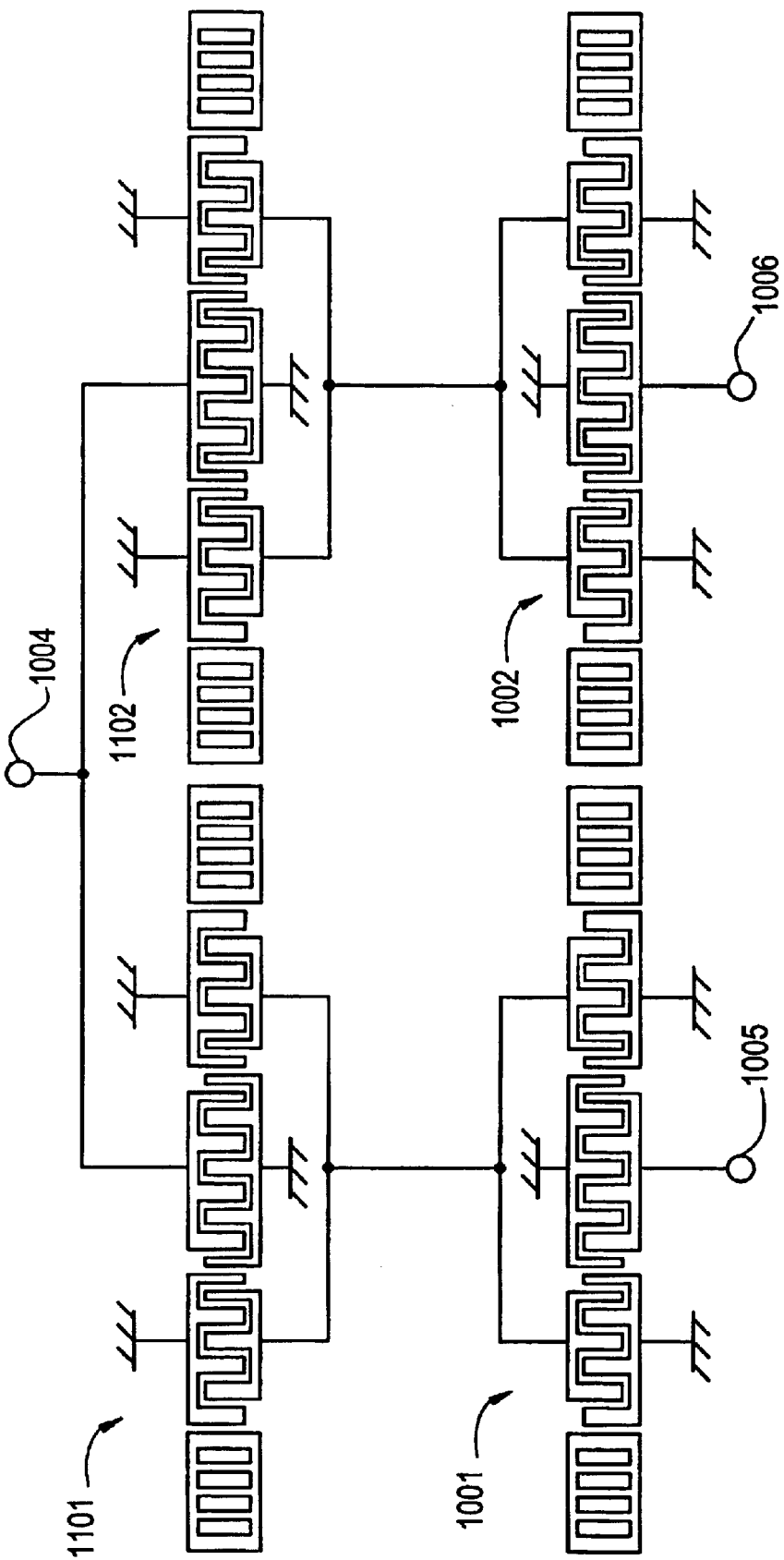
FIG. 13 is a schematic plan view showing a surface acoustic wave filter of the type using cascaded resonators as still another example of surface acoustic wave filter used to implement various preferred embodiments of the present invention.
Figure 14:
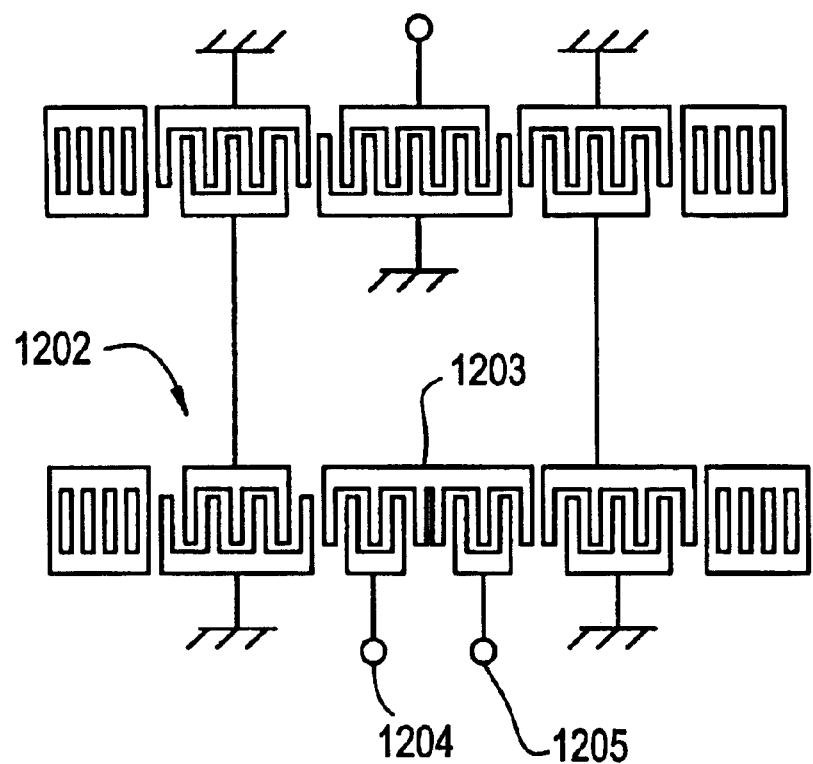
FIG. 14 is a schematic plan view showing a surface acoustic wave filter of the type using cascaded resonators as yet another example of surface acoustic wave filter used to implement various preferred embodiments of the present invention.

Furthermore, as shown in FIG. 13, the arrangement may be such that the overlap width of the surface acoustic wave filter 1003 shown in FIG. 12 is reduced to one half, the surface acoustic wave filter 1003 is divided into two surface acoustic wave filters 1101 and 1102 of the type using cascaded resonators, and the surface acoustic wave filters 1101 and 1102 are respectively connected in series to the surface acoustic wave filters 1001 and 1002. Furthermore, as shown in FIG. 14, the arrangement may be such that two surface acoustic wave filters 1201 and 1202 of the type using cascaded resonators are cascaded to define two stages, the middle IDT 1203 of the surface acoustic wave filter 1202 is divided into two, and the two IDT segments are connected respectively to balanced output terminals 1204 and 1205, so that balanced signals will be obtained.

That is, according to preferred embodiments of the present invention, the construction of the electrode fingers of the surface acoustic wave filter having a function of unbalanced/balanced conversion is not limited specifically, and any of the above modifications achieves an improvement in balance similarly to the preferred embodiments of the present invention, thereby improving stopband attenuation.

Although the filter for DCS reception and the filter for PCS reception are contained in a single package in preferred embodiments described above, according to the present invention, three or more surface acoustic wave filters may be contained in a single package. Furthermore, according to preferred embodiments of the present invention, various surface acoustic wave filters other than those used for DCS reception and PCS reception may also be contained in a single package. For example, a filter for EGSM reception and a filter for DCS reception may be contained in a single package, or a surface acoustic wave filter for EGSM reception, a surface acoustic wave filter for DCS reception, and a surface acoustic wave filter for PCS reception may be contained in a single package.

Figure 15:
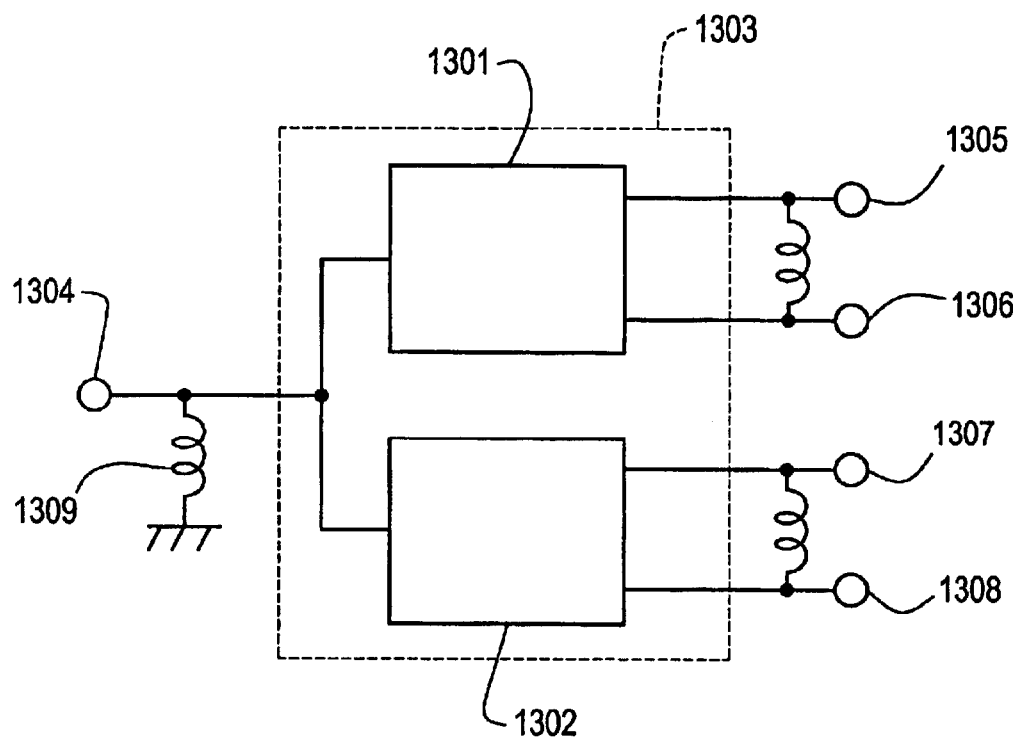
FIG. 15 is a schematic construction diagram of a surface acoustic wave device according to a second preferred embodiment of the present invention.

FIG. 15 is a schematic block diagram showing the construction of a surface acoustic wave device according to a second preferred embodiment of the present invention. In the surface acoustic wave device according to the second preferred embodiment, a surface acoustic wave filter 1301 for DCS reception and a surface acoustic wave filter 1302 for PCS reception preferably include Al electrodes disposed on a single piezoelectric substrate (not shown). The piezoelectric substrate is preferably the same as in the first preferred embodiment. Similarly to the first preferred embodiment, a surface acoustic wave device including the surface acoustic wave filters 1301 and 1302 are mounted in a package 1303 by the face-down manufacturing method.

The second preferred embodiment differs from the first preferred embodiment in that the surface acoustic wave filters 1301 and 1302 share a common unbalanced input terminal 1304, and an inductor 1309 is attached in parallel to the unbalanced input terminal 1304. The construction on the side of balanced output terminals 1305, 1306, 1307, and 1308 is the same as in the first preferred embodiment of the present invention.

Figure 19:
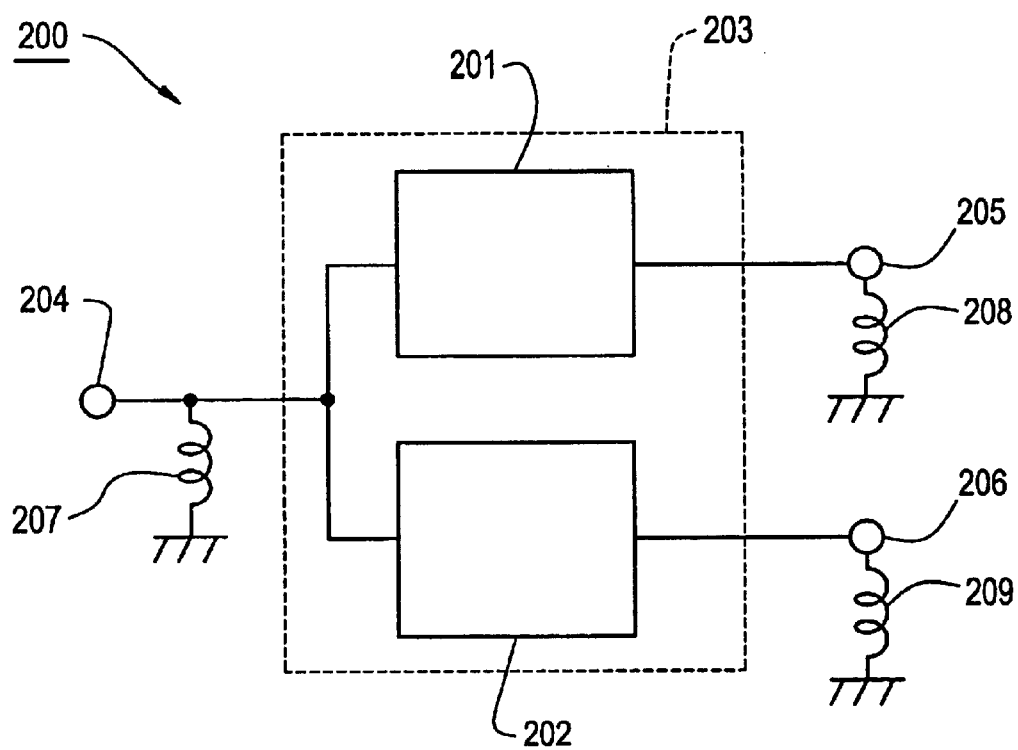
FIG. 19 is a schematic construction diagram of a surface acoustic wave device according to another related art.

Even if the unbalanced input signal terminal is shared as in the second preferred embodiment, because the output terminals of the surface acoustic wave filters 1301 and 1302 are balanced, stopband attenuation is improved compared with the surface acoustic wave device according to the related art shown in FIG. 19.

Furthermore, compared with the related art shown in FIG. 18, although the related art shown in FIG. 19 has had the advantage that the shared input terminal eliminates the need for a switch for switching between two signal paths in the circuitry, the related art shown in FIG. 19 has suffered the problem that the impedance matching element 207 is required and therefore, for example, impedance matching elements 208 and 209 must be provided on the output side, the attenuation thus being reduced due to electromagnetic coupling between the impedance matching elements 208 and 209. As opposed to the related art shown in FIG. 19, in the surface acoustic wave device according to the second preferred embodiment, the output terminals 1305, 1306, 1307, and 1308 are balanced, so that common-mode signals due to electromagnetic coupling is cancelled, thereby improving stopband attenuation.

In the surface acoustic wave device according to the second preferred embodiment of the present invention, the specific constructions of the surface acoustic wave filters 1301 and 1302 may be the same as the surface acoustic wave device 200 according to the related art shown in FIG. 19. More specifically, impedance matching can be readily achieved by connecting a surface acoustic wave resonator in series between the common unbalanced input terminal 1304 and the surface acoustic wave filters 1301 and 1302. Impedance matching can be further facilitated by attaching the surface acoustic wave resonator between at least the surface acoustic wave filter having the relatively highest center frequency and the common unbalanced input terminal 1304. Furthermore, attenuation in the proximity of the pole in the higher side of the passband can be further increased by making the anti-resonance frequency of the surface acoustic wave higher than the higher side of the passband of the surface acoustic wave filters.

Furthermore, the sharpness of attenuation in the higher range of the passband can be further improved by withdrawing and weighting the surface acoustic wave resonator, or making the electrode thickness of the surface acoustic wave resonator thinner than that of the surface acoustic wave filters.

Figure 16:
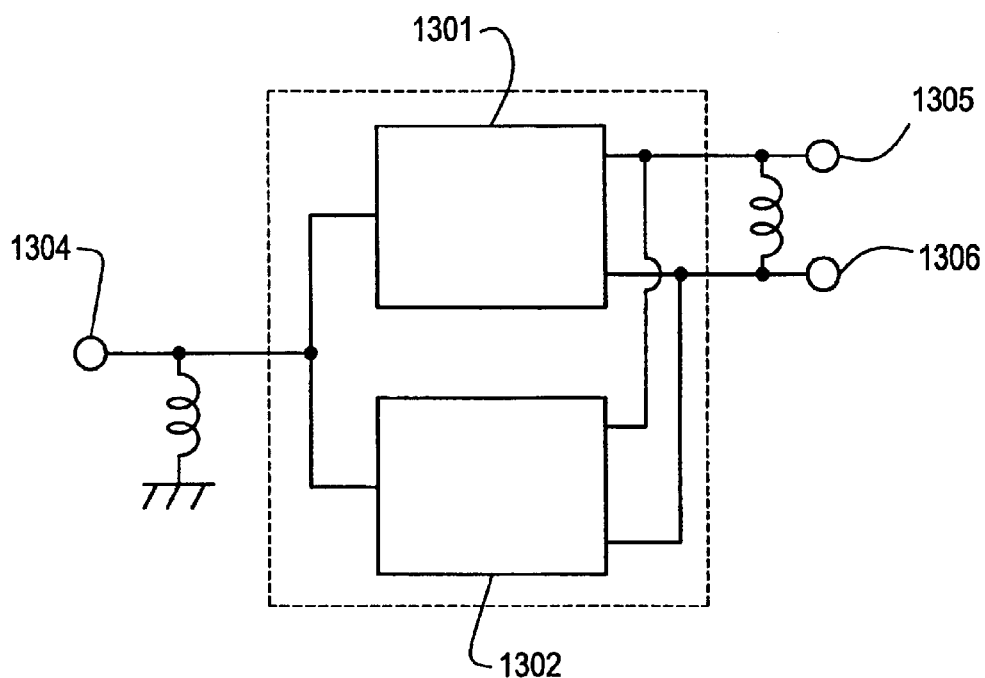
FIG. 16 is a schematic construction diagram showing a modification of the surface acoustic wave device according to the second preferred embodiment of the present invention.

Although the inductor 1309 is connected in parallel to the unbalanced input terminal 1304 in the second preferred embodiment, an impedance matching element other than the inductor 1309 may be used. Furthermore, as shown in FIG. 16, the arrangement may be such that the balanced output terminals of the surface acoustic wave filters 1301 and 1302 are connected in parallel, so that the unbalanced input terminal 1304 and the pair of balanced output terminals 1305 and 1306 constitute a surface acoustic wave device having two passbands.

Figure 17:
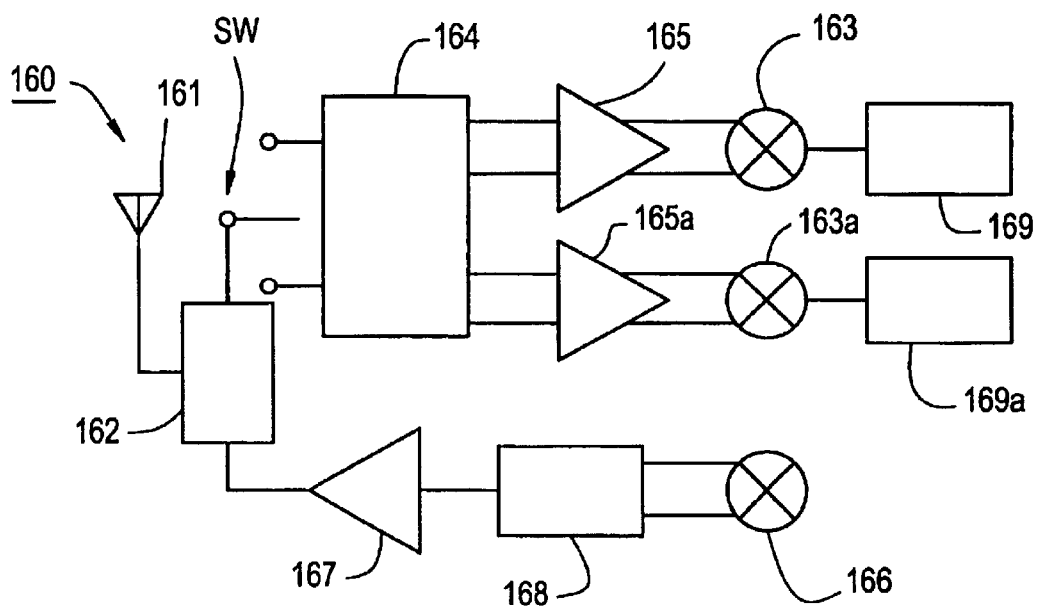
FIG. 17 is a schematic block diagram showing the construction of a communications device incorporating a surface acoustic wave filter according to various preferred embodiments of the present invention.

FIG. 17 is a block diagram of a communications apparatus 160 according to another preferred embodiment of the present invention, which includes a surface acoustic wave device according to other preferred embodiments of the present invention.

Referring to FIG. 17, a diplexer 162 is connected to an antenna 161. Between the diplexer 162 and receiver mixers 163 and 163a, a switch SW, a surface acoustic wave filter 164 and amplifiers 165 and 165a constituting an RF stage are connected. Furthermore, surface acoustic wave filters 169 and 169a constituting an IF stage are connected to the mixers 163 and 163a, respectively. Furthermore, between the diplexer 162 and a transmitter mixer 166, an amplifier 167 and a surface acoustic wave filter 168 constituting an RF stage are connected.

A surface acoustic wave device according to other preferred embodiments of the present invention described above can be suitably used as the surface acoustic wave filter 164 in the communications apparatus 160.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A surface acoustic wave device comprising:
   a package;
   a plurality of surface acoustic wave filters having different center frequencies and included in said package; and
   an impedance matching element; wherein
      one of an input terminal and an output terminal of at least one of said plurality of surface acoustic wave filters is a balanced terminal and the other of the input terminal and the output terminal of said at least one of said plurality of surface acoustic wave filters is an unbalanced terminal;
      one of the input terminal and the output terminal of each of said plurality of surface acoustic wave filters is a balanced terminal and the other of the input terminal and the output terminal of each of said plurality of surface acoustic wave filters is an unbalanced terminal; and
      the unbalanced terminal is shared among said plurality of surface acoustic wave filters;
      said impedance matching element is connected to the shared unbalanced terminal; and
      said impedance matching element is an inductor connected in parallel to the unbalanced terminal.

2. A surface acoustic wave device according to claim 1, wherein at least one of said plurality of surface acoustic wave filters is a surface acoustic wave filter including cascaded resonators.

3. A surface acoustic wave device according to claim 1, wherein at least one of said plurality of surface acoustic wave filters has a different electrode thickness from the other surface acoustic wave filters.

4. A surface acoustic wave device according to claim 3, wherein each of said plurality of surface acoustic wave filters is disposed on a single piezoelectric substrate.

5. A surface acoustic wave device according to claim 1, wherein one of the plurality of surface acoustic wave filters is constructed to perform DCS reception and another of the surface acoustic wave filters is constructed to perform PCS reception.

6. A surface acoustic wave device according to claim 1, wherein the plurality of surface acoustic wave filters are integral with each other.

7. A surface acoustic wave device according to claim 1, further comprising a single substrate, wherein said plurality of surface acoustic wave filters are defined by electrodes disposed on said single substrate.

8. A surface acoustic wave device according to claim 7, wherein said single substrate is a 40±5° Y-cut X-propagating $LiTaO_3$ substrate.

9. A surface acoustic wave device according to claim 1, further comprising a single substrate, wherein said plurality or surface acoustic wave devices mounted face-down on the single substrate.

10. A surface acoustic wave device according to claim 1, wherein said package includes a base substrate and a surrounding sidewall fixed on the base substrate.

11. A surface acoustic wave device according to claim 1, wherein each of the surface acoustic wave filters is constructed to perform a function of unbalanced/balanced conversion.

12. A surface acoustic wave device according to claim 1, further comprising an inductor connected between the balanced output terminals.

13. A surface acoustic wave device according to claim 12, further comprising a substrate on which said plurality of surface acoustic waves are provided, wherein the inductor is provided within the package or on the substrate.

14. A surface acoustic wave device according to claim 1, further comprising an inductor connected to the package.

15. A surface acoustic wave device according to claim 14, further comprising a substrate on which said plurality of surface acoustic waves are provided, wherein the inductor is provided within the package or on the substrate.

16. A communications device comprising a surface acoustic wave device according to claim 1.

17. The communications device according to claim 16, wherein said surface acoustic wave device defines a bandpass filter.

* * * * *